(12) United States Patent
Redon et al.

(10) Patent No.: US 8,489,370 B2
(45) Date of Patent: Jul. 16, 2013

(54) COMPUTER DEVICE FOR SIMULATING A SET OF OBJECTS IN INTERACTION AND CORRESPONDING METHOD

(75) Inventors: Stéphane Redon, Grenoble (FR); Romain Rossi, Grenoble (FR)

(73) Assignee: INRIA Institut National de Recherche en Informatique et en Automatique, Le Chesnay (FR)

( * ) Notice: Subject to any disclaimer, the term of this patent is extended or adjusted under 35 U.S.C. 154(b) by 530 days.

(21) Appl. No.: 12/665,675

(22) PCT Filed: Jun. 13, 2008

(86) PCT No.: PCT/FR2008/000825
§ 371 (c)(1),
(2), (4) Date: Feb. 2, 2010

(87) PCT Pub. No.: WO2009/007550
PCT Pub. Date: Jan. 15, 2009

(65) Prior Publication Data
US 2010/0179795 A1    Jul. 15, 2010

(30) Foreign Application Priority Data
Jun. 20, 2007 (FR) .................................. 07 04414

(51) Int. Cl.
G06G 7/48 (2006.01)
(52) U.S. Cl.
USPC .................................................. 703/6; 703/7
(58) Field of Classification Search
USPC .............................................. 703/6, 7
See application file for complete search history.

(56) References Cited

U.S. PATENT DOCUMENTS 8,140,189 B2 * 3/2012 Nagasaka ........................ 700/262
2009/0319892 A1 * 12/2009 Wright et al. ................... 715/701

OTHER PUBLICATIONS

International Search Report, dated Dec. 29, 2008, corresponding to PCT/FR2008/00825.
Featherstone, "A Divide-and-Conquer Articulated-Body Algorithm for Parallel $O(\log(n))$ Calculation of Rigid-Body Dynamics. Part 1: Basic Algorithm," The International Journal of Robotics Research, vol. 18, No. 9, Sep. 1999, pp. 867-875, Sage Publications, Inc. 1999 (XP009097199).

(Continued)

Primary Examiner — Omar Fernandez Rivas
Assistant Examiner — Herng-Der Day
(74) Attorney, Agent, or Firm — Christie, Paker & Hale, LLP

(57) ABSTRACT

Computer device for simulating a set of objects in interaction and corresponding method. A computer device for simulating a set of objects in interaction comprises: a memory (8) with a tree representation of the objects, each node being associated with dynamic, geometric and interaction data dependent on the data of the child nodes and local interaction data for certain nodes, a simulation controller (4), for actuating repeatedly: + a distributor (10) of interaction data, with a mechanism for interaction updating which scans the tree representation and updates an item of interaction data of a node as a function of the local interaction data of its child nodes, + a mechanism for updating the dynamic data (12) which scans the tree representation and operates as a function of the geometric interaction data concerned, + a mechanism for updating the geometric data (14) which scans the tree representation for nodes subject to interaction and operates as a function of the dynamic data updated. The invention also relates to a method for simulating a set of objects in interaction, and a computer program product.

8 Claims, 7 Drawing Sheets

OTHER PUBLICATIONS

Featherstone, "A Divide-and-Conquer Articulated-Body Algorithm for Parallel $O(\log(n))$ Calculation of Rigid-Body Dynamics. Part 2: Trees, Loops and Accuracy," The International Journal of Robotics Research, vol. 18, No. 9, Sep. 1999, pp. 876-892, Sage Publications, Inc. 1999 (XP009097198).

Redon, et al., "An Efficient, Error-Bounded Approximation Algorithm for Simulating Quasi-Statics of Complex Linkages," ACM Symp. Solid Model. Appl. SM; ACM Symposium on Solid Modeling and Applications, SM; Proceedings SPM 2005—ACM Symposium on Solid and Physical Modeling 2005, 2005, pp. 175-186 (XP009097141).

Redon, et al., "Adaptive Dynamics of Articulated Bodies," ACM Transactions on Graphics ACM USA, vol. 24, No. 3, Jul. 2005, pp. 936-945 (XP002473071).

Gottschalk, et al., "OBBTress: A Hierarchical Structure for Rapid Interference Detection," Computer Graphics Proceedings, Anual Conference Series, 1996, pp. 171-180 (XP000682733).

* cited by examiner ered not only to make the present invention easier to understand, but also to help defining it, where appropriate.

COMPUTER DEVICE FOR SIMULATING A SET OF OBJECTS IN INTERACTION AND CORRESPONDING METHOD

CROSS-REFERENCE TO RELATED APPLICATION

This application is a National Phase Patent Application and claims the priority of International Application Number PCT/FR2008/000825, filed on Jun. 13, 2008, which claims priority of French Patent Application Number 0704414, filed on Jun. 20 2007.

BACKGROUND

The invention relates to the simulation of a set of objects in interaction.

The simulation of objects in interaction is a huge field which extends from the simulation of a multitude of more or less complex mechanical bodies to the simulation of the behaviour of molecules, such as proteins, for example.

The first approaches developed had the aim of assembling objects, i.e. grouping them together in order to define global behaviour. This type of approach is useful because of its relatively low computation costs.

However, the reduction in the computation costs is achieved to the detriment of the realism of the simulation inasmuch as numerous aspects relating to the correlations between the grouped objects are deliberately ignored or reduced to their simplest expression.

Other approaches have involved looking at objects in interaction as articulated bodies. An articulated body is generally made up of two bodies joined together by a joint. The two bodies may themselves be articulated bodies and so on. This approach has made it possible to produce faithful models of the mechanical behaviour of sets of objects of this kind while retaining a high performance level.

The term "mechanical" behaviour is used because the objects interact essentially by means of the articulation or joint that connects them. Thus, it is necessary only to model the joints in order to model the set of objects.

When the interactions between the objects become more complex, these approaches become ineffective quite quickly, as the calculation requirements/costs associated with them become prohibitive.

SUMMARY

The invention sets out to improve the situation.

To this end, the invention proposes a computer device for simulating a set of objects in interaction which comprises a memory containing a tree representation of the set of objects. In this tree representation, each of the intermediates is associated with dynamic data, geometric data and interaction data.

The device further comprises a simulation controller which actuates, in a repetitive cycle:
  a distributor of interaction data relating to the objects and subsets of objects,
  a mechanism for updating the dynamic data, with a scan of the tree representation for nodes subject to interactions, as a function of the interaction data and geometric data in question,
  a mechanism for updating the geometric data, with a scan of the tree representation for nodes subject to interactions, as a function of the updated dynamic data.

In order to take account of the interactions between nodes which are independent of the articulations, the memory also comprises local interaction data that are associated with at least some of the nodes, and the interaction data distributor comprises an interaction updating mechanism, with a scan of the tree representation for interacting subjects, in order to update an interaction data item of a node as a function of the local interaction data of child nodes in question.

A device of this kind is particularly advantageous as it provides the possibility of extending the approach using modelling with articulated bodies, while taking into account forces that are not exclusively articular, without significantly increasing the computing time, and thereby increasing the usefulness of the simulation.

The invention also relates to a method of simulating the behaviour of a set of objects in interaction in which a tree representation of the set of objects is maintained. In the representation, each intermediate node is associated with dynamic data, geometric data and interaction data dependent on data from its child nodes.

The method repeatedly runs a cycle comprising the following steps:
a. distributing the interaction data over some of the objects and subsets of objects,
b. scanning the tree representation for nodes subject to interaction, while updating the dynamic data of these nodes, as a function of the interaction data and geometric data concerned, and
c. scanning the tree representation again for nodes that are subject to interaction, while updating the geometric data, as a function of the dynamic data as updated in step b.
More specifically, step a. comprises:
a1. a preliminary scan of the tree representation for nodes that are subject to interaction, with the updating of the interaction data of these nodes, as a function of local interaction data of child nodes in question.

BRIEF DESCRIPTION OF THE DRAWINGS

Further features and advantages of the invention will become apparent from a study of the description that follows, taken from examples provided as a non-restrictive illustration, based on the drawings, wherein.

DETAILED DESCRIPTION

Figure 1:
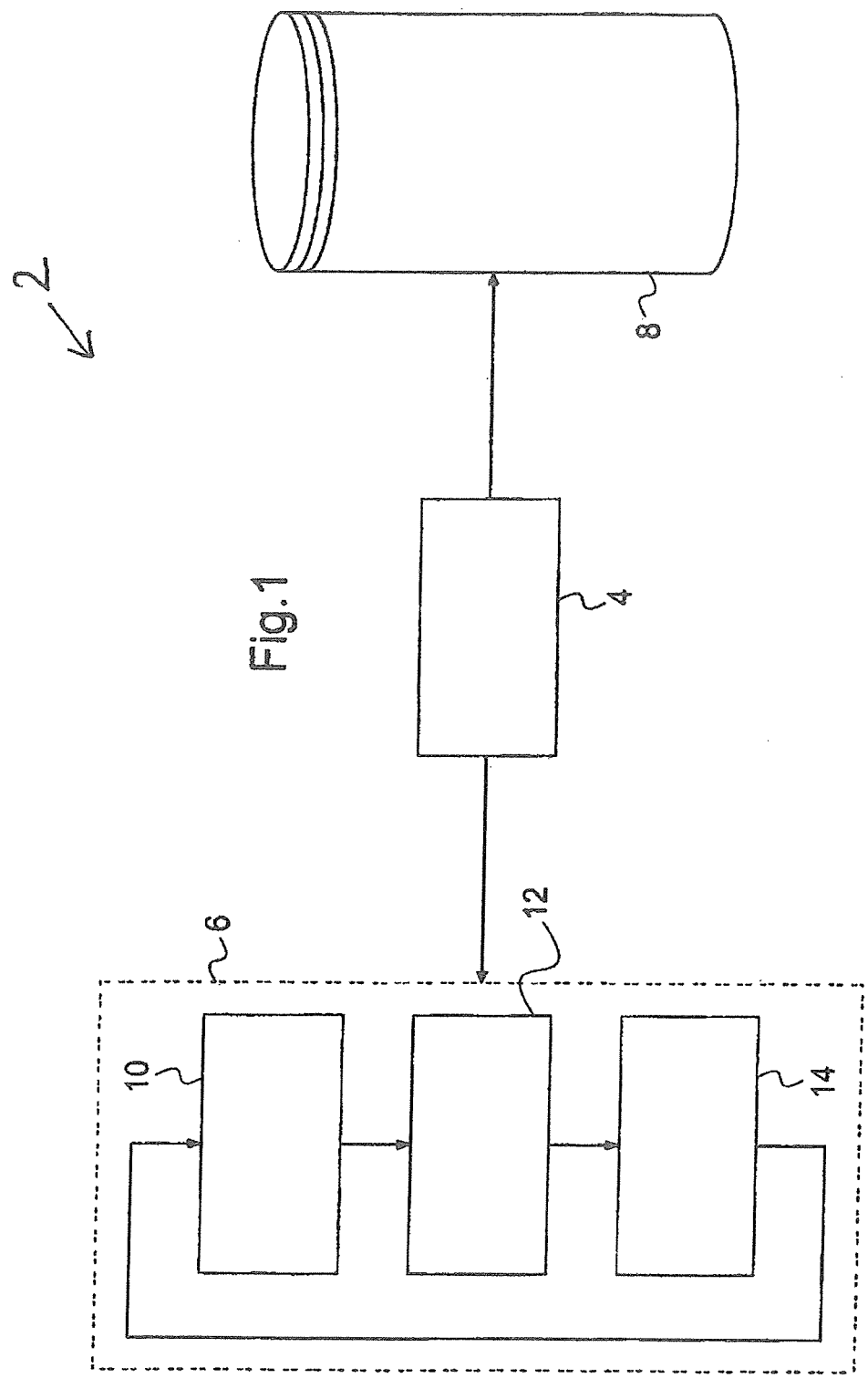
FIG. 1 shows a schematic diagram of a computer device according to the invention.

The drawings and description that follow essentially contain elements of a definite nature. They may therefore serve not only to assist with the understanding of the present invention but may also contribute to its definition, in some cases.

The present description is of a nature to use elements eligible for protection by authorship and/or copyright. The proprietor of the rights has no objection to the identical reproduction by anyone of the present patent document or its description, as it appears in the official files. Otherwise, they reserve their rights in full.

The invention also encompasses, as products, the software elements described, provided in any computer-readable "medium" (support). The phrase "computer-readable medium" covers magnetic, optical and/or electronic data storage supports, as well as a transmission support or carrier, such as an analogue or digital signal.

In addition the detailed description is supplemented by Annex A, which provides certain mathematical formulae used within the scope of the invention. This Annex is provided with the aim of clarification and to assist with looking up. It forms an integral part of the description and may therefore serve not only to assist with the understanding of the present invention but may also contribute to its definition, in some cases.

A first approach to the mechanical simulation of articulated bodies has been proposed in the article "*A divide-and-conquer articulated body algorithm for parallel o(log(n)) calculation of rigid body dynamics. Part 1: Basic Algorithm*", International Journal of Robotics Research 18(9):867-875 by Featherstone, hereinafter referred to as Featherstone '99.

Featherstone '99 describes an algorithm for cutting up an articulated body into a binary tree, in order to calculate all the components of force and position recursively. By articulated body is meant the whole unit that comprises an articulation, or joint, connecting two bodies that may themselves be articulated bodies.

The notion of an articulated body therefore must not be restricted to its simple mechanical connotation The notion of articulation must also be understood in the wider sense. For example, an articulation may comprise a variable number of degrees of freedom, of between nought (rigid coupling of the two sub-sets) and six (unrestricted relative movement of the two sub-sets).

The binary tree comprises leaf nodes which represent the most basic elements of the articulated object, and which are each attached to a joint or node. Thus, each node of the binary tree is itself an articulated body that denotes a sub-set of objects.

The article "*An Efficient, Error-Bounded Approximation Algorithm for Simulating Quasi-Statics of Complex Linkages*", Proceedings of ACM Symposium on Solid and Physical Modeling, 2005, by Redon and Lin, hereinafter referred to as SPM '05, completes this approach by defining the acceleration metrics of the joints.

These metrics make it possible to evaluate the acceleration of the articulated body associated with a given joint, purely from the data of this joint, without knowing the data of the leaves. It is thus possible to make the tree "rigid" by cancelling the acceleration of an articulated body for which the acceleration metrics are below a chosen threshold. Making the tree rigid thus makes it possible to restrict the scan of the tree to a reduced number of nodes while reliably achieving a faithful simulation.

In the article "*Adaptative Dynamics of Articulated Bodies*", ACM Transactions on Graphics (SIGGRAPH 2005), 24(3), by Redon, Gallopo and Lin, hereinafter referred to as SIGGRAPH '05, the quality of the simulation is improved by also processing the dynamic case and also only the quasi-static case, and by adding a method for taking account of the rigidification, so as to avoid creating forces which have no concrete reality.

The embodiments described herein take advantage of all these methods and may in some cases be implemented as extensions thereof, although numerous other embodiments of the invention may be envisaged.

For the simulation, each node of the tree is associated with various data. Three main types of data are distinguished, which will be described in more detail hereinafter: interaction data, dynamic data and geometric data.

The interaction data may be defined as follows: they represent forces applied to a given node, or to a given object in the sub-set of objects represented by this node. These forces may be classified into two types of forces:

stress forces, linked to the interactions of the objects via the articulations, and local forces, which encompass all the other forces that may be applied to a given node.

In the example described here, the objects are molecules and atoms, and the local forces comprise on the one hand the external forces which are applied individually to the joints, and on the other hand all the inter-atomic and inter-molecular forces, such as electrostatic forces, van der Waals forces, etc.

The dynamic data represent composite data characteristic of the dynamics of the articulated bodies. These data make it possible to calculate the acceleration and velocity metrics of the joints without necessarily knowing all the position and force data of the set of objects. The application thereof will be described more fully below.

The geometric data represent a set of data characteristic of the articulated bodies which depend exclusively on the relative positions of the objects to one another. These data make it possible in particular to carry out most of the calculations in local reference points, which makes simulation easier. Here again, these data will be explained hereinafter.

The embodiment described here applies to a quasi-static simulation of the objects. This means that their velocity is deemed to be zero at any one time.

FIG. 1 shows a schematic representation of a device according to the invention.

The device 2 comprises a simulation controller 4, a simulation block 6 and a memory 8. The simulation block 6 comprises an interaction data distributor 10, a dynamic data updating mechanism 12 and a geometric data updating mechanism 14.

During a simulation, the controller 4 repeatedly actuates the simulation block 6 according to a simulation loop which will be described hereinafter on the basis of data contained in the memory 8.

The device 2 may take various forms. The currently preferred embodiment is a computer program which operates the controller 4 and the block 6 in a form that can be executed on a commercially available computer, for example a computer having a 1.7 GHz microprocessor with 1 GB of RAM memory, and a hard disc large enough to contain an operating system and the program code.

However, other embodiments are possible, such as a construction in the form of a specialised printed circuit (daughter board, ASIC, etc.) or a dedicated processor (FPGA, microchip, etc.).

Figure 2:
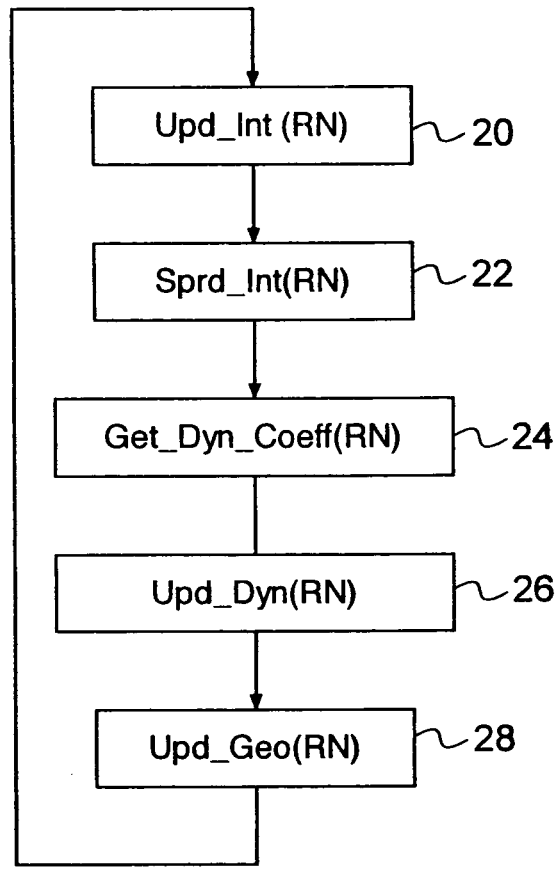
FIG. 2 shows a block diagram of an application by the functions of a simulation loop carried out by the device in FIG. 1.

FIG. 2 shows a schematic diagram of the operation of the simulation loop created by the block 6. In this loop, the functions Upd_Int ( ) 20, Sprd_Int( ) 22, Get_Dyn_Coeff( ) 24, Upd_Dyn( ) 26, and Upd_Geo( ) 28 are called up successively.

The loop shown in FIG. 2 represents the main steps of the simulation in a given operating loop. These steps are, respectively, the updating of the inter-object interactions of a non-articular nature, the broadcasting of these interactions, the obtaining and updating of the dynamic simulation parameters, then the updating of the geometric simulation parameters.

Although the different steps shown in FIG. 2 correspond to functions in the programme that implements the invention, it will become apparent hereinafter that these functions themselves comprise a number of sub-functions, and should be considered as functional components which the skilled man will be free to implement as he chooses.

From a functional point of view, it may be considered that:
the functions Upd_Int( ) 20 and Sprd_Int( ) 22 constitute a nucleus of the data distributor 10,
the functions Get_Dyn_Coeff( ) 24 and Upd_Dyn( ) 26 constitute a nucleus of the dynamic data updating mechanism 12, and
the function Upd_Geo( ) 28 constitutes a nucleus of the geometric data updating mechanism 14.

Figure 3:
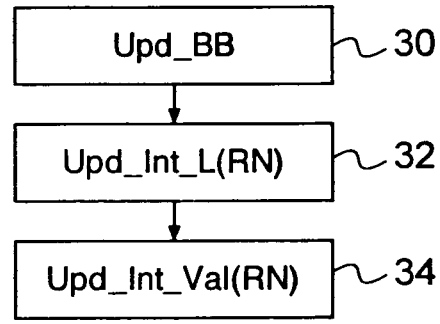
FIG. 3 shows a block diagram of a first function of the simulation loop in FIG. 2.

FIG. 3 represents a possible implementation of the function Upd_Int( ) 20 in FIG. 2. As can be see from this Figure, the function Upd_Int( ) 20 comprises three sub-functions, Upd_BB( ) 30, Upd_Int_L( ) 32 and Upd_Int_Val( ) 34.

In the conventional approach, as soon as a sub-set of objects is made rigid, the latter temporarily ceases to be processed in the simulation. As the forces taken into consideration in this type of simulation are of a mechanical nature, this sub-set may be spatially very close to another sub-set of objects without any consequences arising from this.

If it is desired to simulate the behaviour of a protein or a molecular chain, local interatomic forces of the electrostatic or van der Waals type are added to the stress and external forces.

Then, "mechanical" simulation is no longer sufficient as it becomes possible for a rigidified sub-set to interact with another sub-set. It is thus necessary to "de-rigidify" it in order to take account of these new local forces, which depend only on the relative position of the objects to one another. This is not possible to achieve with the existing approach without losing all its advantages.

The function Upd_Int ( ) 20 makes it possible to take account of these local forces. In order to do this, this function starts from a given molecular situation and makes it possible to determine, in a first period, which objects are liable to interact with one another. In a second period this function calculates the corresponding local forces and integrates these data in an ordered manner.

The function Upd_BB( ) 30 is an adaptation of the detection of interaction to the molecular simulation. As the interatomic forces are chiefly short distance, this function defines spaces for potential interaction around each object.

More precisely, these spaces are defined as "oriented boxes" surrounding an object or group of objects. The boxes themselves are defined for each node of the binary tree at the start of the simulation, and the function Upd_BB( ) 30 operates by updating the position of a reference point and a direction of orientation for each box.

The principles of oriented boxes, known as "Oriented Bounding Box" or OBB in the literature, are described in the article "Obbtree: a hierarchical structure for rapid interference detection" by Gottschalk et al. in ACM Translations of Graphics (SIGGRAPH 1996).

As the OBBs depend exclusively on the positions of the objects which they surround and as they are expressed in a referential connected to the node to which they are attached, they are unchanged when a node is rigidified. The function Upd_OBB( ) 30 therefore operates exclusively on nodes whose position has changed during the preceding simulation step. This function passes through the binary tree from bottom to top in selective manner, passing through only the so-called active nodes, as will be explained hereinafter.

Figure 4:
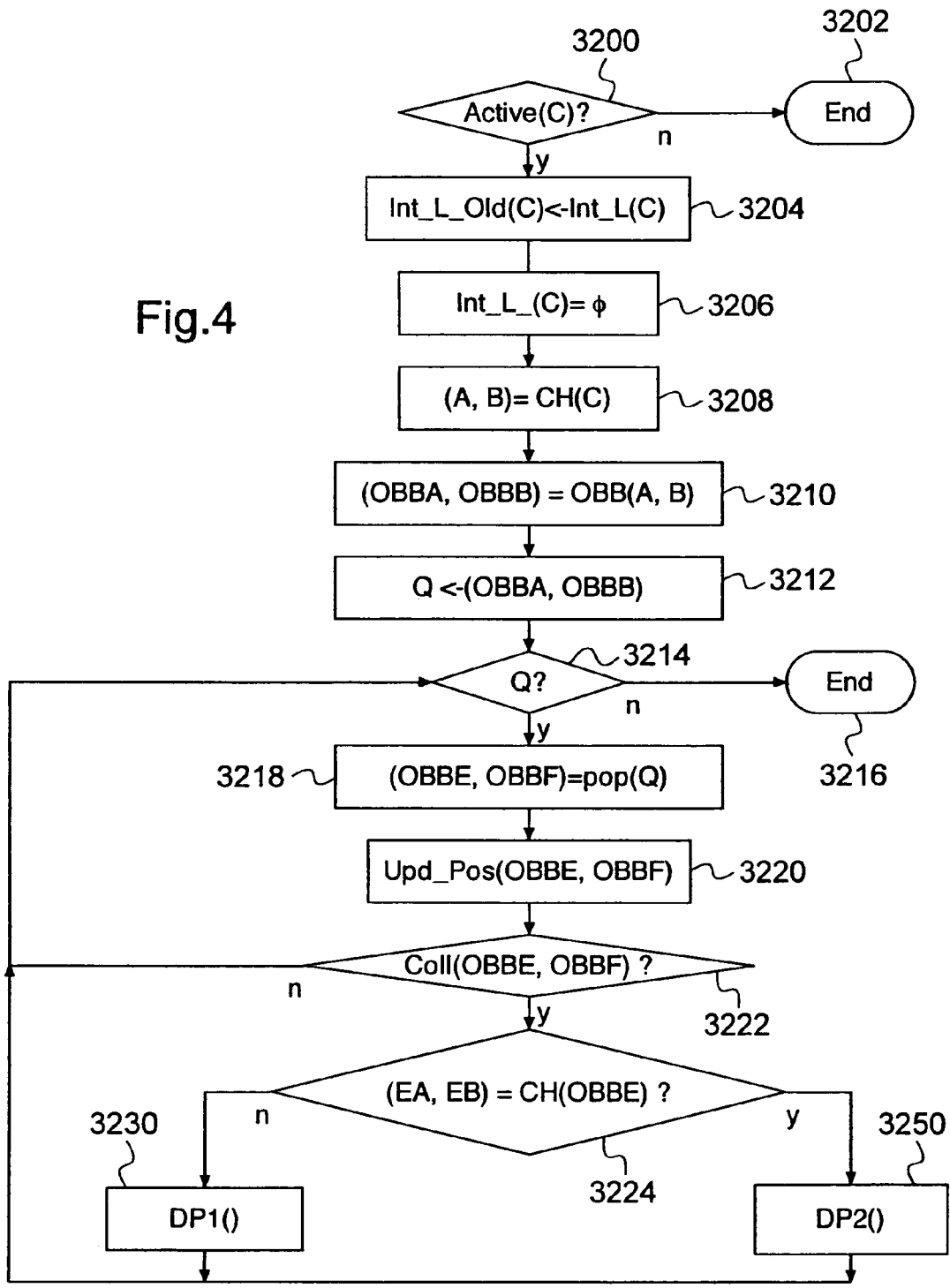
FIG. 4 shows a block diagram of a function in FIG. 3.

The updated OBBs form the working base used by the function Upd_Int_L( ) 32. This function, an implementation of which is shown in FIG. 4, scans the binary tree recursively from top to bottom, from the root RN.

The function Upd_Int_L( ) maintains for each node two main lists Int_L and Int_L_Old. At each node, the list Int_L (or Int_L_Old, respectively) contains pairs of nodes belonging to the sub-set of objects designated by the given node which interact by local forces in the current loop (or the preceding loop, respectively).

These lists make it possible to detect the local interactions that have changed, i.e. the local interactions that have been modified by the positions of the objects following the previous loop.

The function Upd_Int( ) starts from an activity test 3200 on the current node. This test is linked to the acceleration metrics of the current node (or to other suitable metrics, if appropriate), and may be carried out in the form of a calculation of these metrics or in the form of the reading of a data item (commonly referred to as a "flag") which designates whether or not the node is active in nature, which is decided as a function of the value of these metrics.

In the example described here, a node is deemed to be active if the value of its acceleration metrics is greater than a threshold selected by the user, i.e. if it is considered to be non-rigidified. If the node is rigid, this means that the global accelerations within the articulated body associated with the node are deemed to be zero within the scope of the simulation.

As has been seen earlier, this means that the positions of the objects within this body have not changed, since the accelerations of this body have been deemed to be zero. Thus the list of interactions Int_L and Int_Old_L of the previous loop remain valid for this node and all these child nodes, and the function stops (3202).

If the node C is active, the list Int_L(C) of the previous loop becomes the list Int_Old_L(C) for the current loop by overwriting (3204) and the list Int_L(C) is reset to zero (3206).

Then, a loop is started up in order to put all the possible interactions between the children of the node C into a queue. Thus, the two immediate child nodes A and B are recovered by a function CH( ) at 3208 and their respective OBBs, OBBA and OBBB, are recovered at 3210.

The couple (OBBA, OBBB) is then stacked in a list Q (3212), which serves as a storage stack for potential interactions between OBB. The loop mentioned has the emptying of the stack Q (3214) as its stop condition, and the function Upd_Int_L(c) stops when this condition is met (3216).

The loop starts by unstacking from the list Q, which makes it possible to recover the last couple of potential interaction (OBBE, OBBF) introduced into Q (3218). The first iteration of this loop is obviously with the couple (OBBA, OBBB) of step 3212.

At 3220, a function Upd_Pos( ) updates the positions in the real world of the OBBs OBBE and OBBF in order to make it possible to establish whether they have collided. This updating of the "real" position is distinct from that achieved in the function Upd_OBB( ) 30, which updates the relative position of each OBB in the referential of its node.

The distinction between the real position and relative position makes it possible to implement the algorithm in a more effective and integrated manner. It would nevertheless be possible to update the real position of the OBBs directly in the function Upd_OBB( ) 30.

At 3222, the function Coll( ) determines whether OBBE and OBBF are in collision, i.e. whether their oriented boxes have intersected. If this is not the case, then there is no local interaction, and the loop is reset at 3214 to test the next potential interaction.

In the event that OBBE and OBBF, which are associated with respective nodes E and F, are in collision, there are four possibilities:

a) E and F are both leaves of the tree, which means that these objects interact with one another, and the function stops;
b) F is an articulated object and E is a leaf, which means that F has to be explored to determine the interactions of its child nodes with the object associated with E, then determine the interactions of the child nodes of F with one another;
c) E is an articulated object and F is a leaf, which means that E has to be explored to determine the interactions of its child nodes with the object associated with F, then determine the interactions of the child nodes of E with one another; and
d) E and F are both articulated objects, which means that E and F have to be explored in order to determine the interactions between their respective child nodes, then determine the interactions of the child nodes of E and F with one another.

In order to do this, a test 3224 determines whether E is a leaf node, by calling up a function CH_OBB( ) with OBBE. The function CH_OBB( ) is similar to the function CH( ) except that it takes an OBB and not a node at its input.

Figure 5:
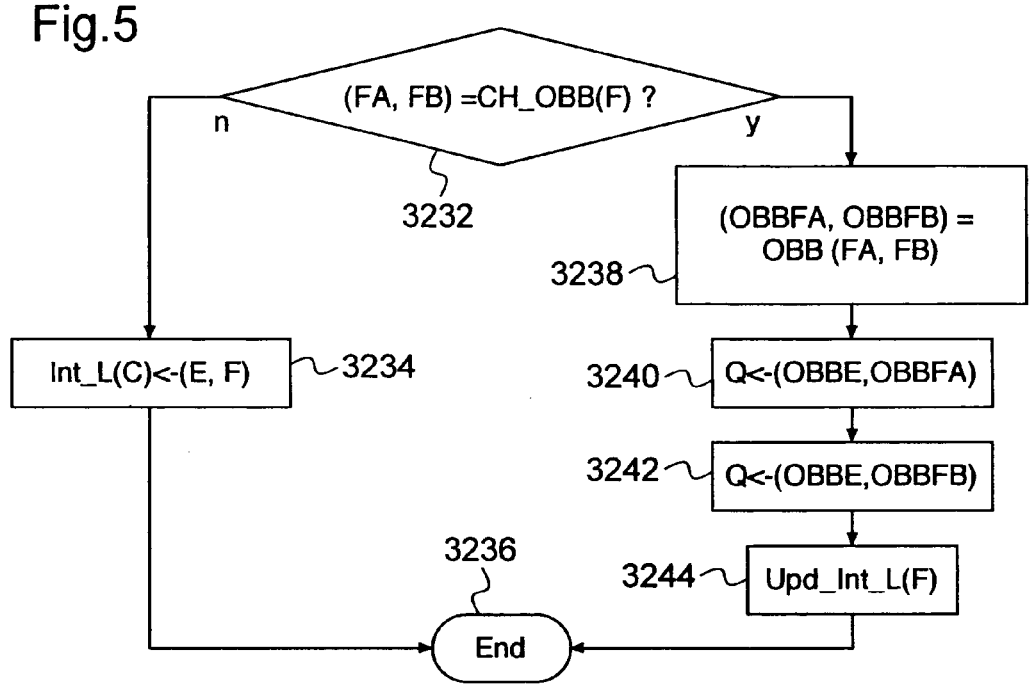
FIGS. 5 and 6 schematically show two functions of FIG. 4.

If E is a leaf node, the function DP1( ) is called up at 3230, which manages the cases a) and b). An example of the implementation of the function DP1( ) is shown in FIG. 5. In this function, a test 3232 determines whether F is a leaf node, by calling up the function CH_OBB( ) with OBBF.

If F is a leaf node, case a) applies, and the list Int_L(C) receives the pair (E, F) at 3234, the function DP1( ) stops at 3236, and the loop of Upd_Int_L(C) resumes at 3214 with the test of the stack Q.

If F is a articulated object, then FA and FB are its children, and case b) applies. In order to determine the interactions of the children of F with E, the OBBs of FA and FB are recovered at 3238, and then two potential interactions (OBBE, OBBFA) are stacked at 3240 and (OBBE, OBBFB) are stacked at 3242 in the stack Q.

Then, the interactions of the children of F with one another are determined by calling up Upd_Int_L( ) with F at 3244. This call up of a function makes it possible to update the list Upd_Old_L(F) and Upd_L(F). Finally, the function DP1( ) stops at 3236, and the loop of Upd_Int_L(C) resumes at 3214 with the test on the stack Q.

Figure 6:
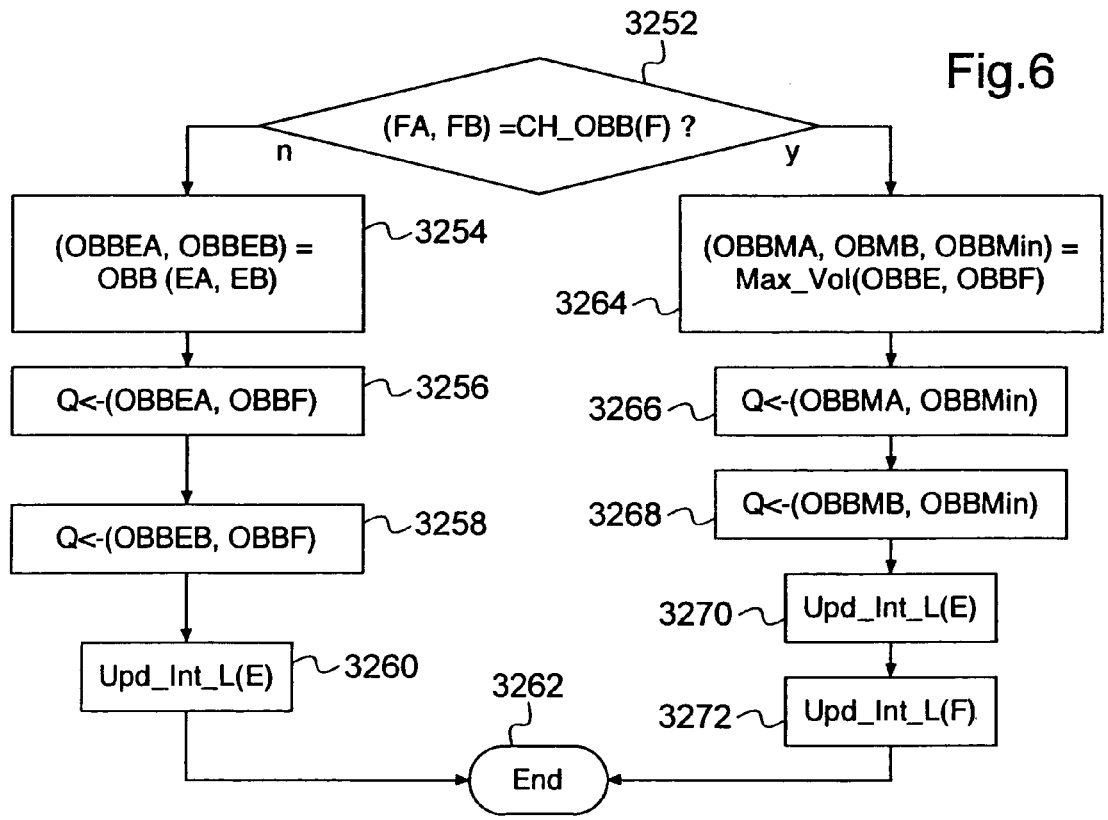

If E is an articulated object, then EA and EB are its children. Then a function DP2( ) is called up at 3250, which manages the cases c) and d). An example of implementation of the function DP2( ) is shown in FIG. 6.

In this function, a test 3252 determines whether F is a leaf node, by calling up the function CH_OBB( ) with OBBF.

If F is a leaf node, then case c) applies. To determine the interactions of the children of E with F, the OBBs of EA and EB are recovered at 3254 and then two potential interactions are stacked (OBBEA, OBBF) at 3256 and (OBBEB, OBBF) at 3258 in stack Q.

Then, the interactions of the children of E with one another are determined by calling up Upd_Int_L( ) with E at 3260. This call up of a function makes it possible to update the list Upd_Old_L(E) and Upd_L(E). Finally, the function DP2( ) stops at 3262 and the loop of Upd_Int_L(C) resumes at 3214 with the test on the stack Q.

If F is an articulated object, then FA and FB are its children, and case d) applies. In order to determine the interactions of the children of E with those of F, a function Max_Vol( ) with OBBE and OBBF is called up at 3264.

The function Max_Vol( ) determines which of OBBE and OBBF has the greater volume, in order to explore the interactions of the children of the node associated with the other node. This makes it possible to optimise the performance of Upd_Int_L( ).

As a result, three OBBs are obtained, OBBMA, OBBMB and OBBMin. Thus, if OBBE is more voluminous than OBBF, then OBBMA contains OBBEA, OBBMB contains OBBEB and OBBMin contains OBBF. In the opposite case, OBBMA contains OBBFA, OBBMB contains OBBFB and OBBMin contains OBBE.

Two potential interactions are then stacked (OBBMA, OBBMin) at 3266 and (OBBMB, OBBMin) at 3268 in the stack Q. Then the interactions of the children of E with one another are determined by calling up Upd_Int_L( ) with E at 3270, and those of the children of F with one another are determined by calling up Upd_Int_L( ) with F at 3272.

These call ups of function make it possible to update the list Upd_Old_L(E), Upd_L(E), Upd_Old_L(F) and Upd_L(F). Finally, the function DP2( ) stops at 3262, and the loop of Upd_Int_L(C) resumes at 3214 with the test on the stack Q.

As is implicitly shown, the function Upd_Int( ) applied to a node C therefore has two interwoven recursions.

The first recursion relates to the stacking and unstacking of the stack Q, in order to analyse all the potential interaction couples between the children of the node C, irrespective of their depth level in relation to this node.

The second recursion concerns the selective calling up of the function Upd_Int( ) with child nodes of C, which makes it possible to update the lists Upd_Old_L( ) and Upd_L( ) of all the active nodes.

Determining the local interactions in the binary tree is principally based on the properties of the OBBs, as seen above. However, although the OBBs constitute a valuable tool, other tools may be used, such as interaction prediction tables, or other suitable tools which the skilled man will be able to envisage in the light of the particular application.

When the lists Upd_Old( ) L and Upd_L( ) have been updated for all the active nodes, the interaction data are ready to be updated with the function Upd_Int_Val( ) 34.

Figure 7:
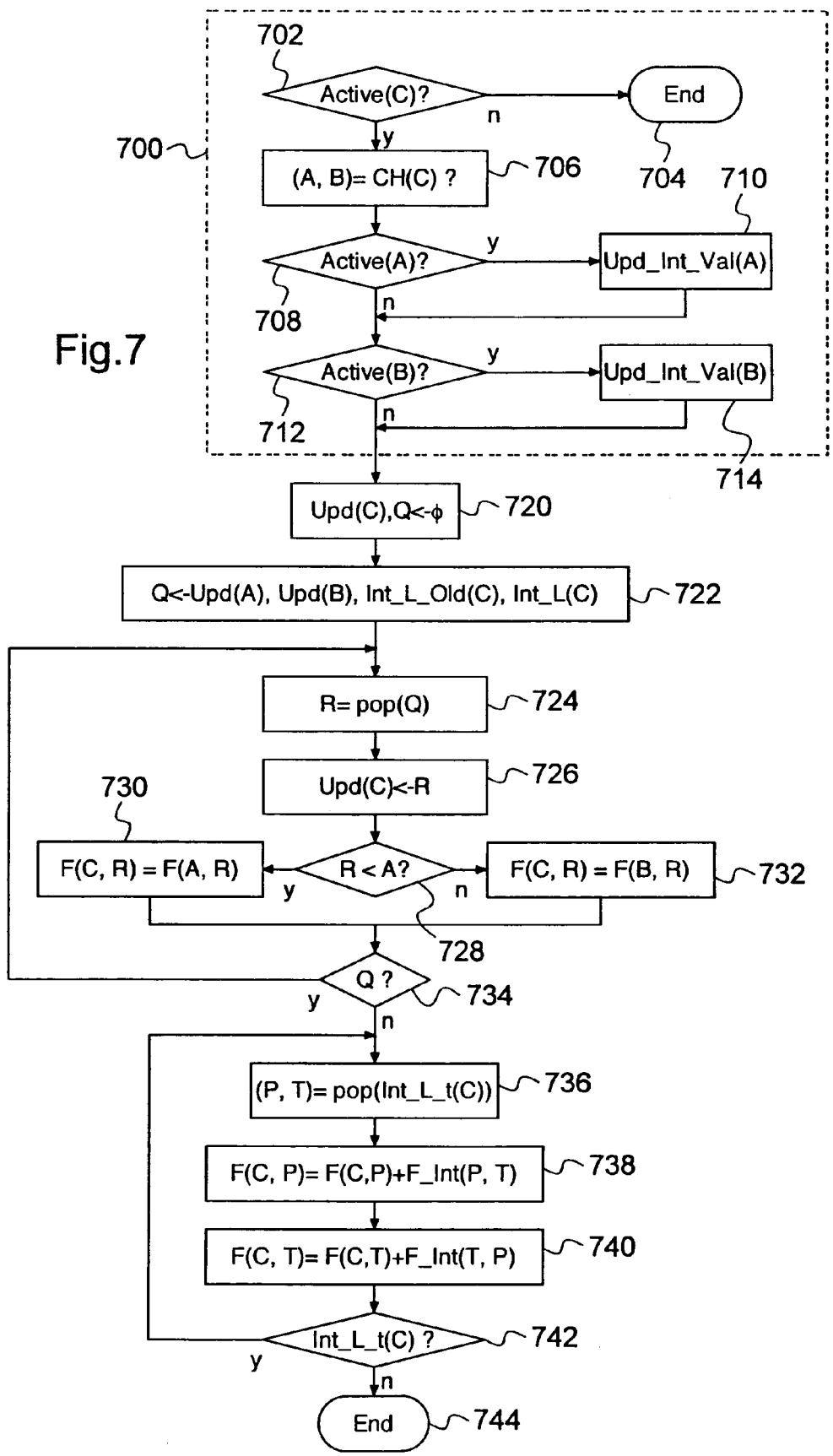
FIG. 7 shows a block diagram of another function of FIG. 3.

One implementation of the function Upd_Int_Val( ) is shown in FIG. 7. As can be seen from this Figure, this function starts with a recursive block 700. By calling up the function Upd_Int_Val( ) with the node RN, the block 700 carries out a descent in the binary tree.

The block 700 starts at 702 with an activity test on the current node C, as described hereinbefore. If the current node is inactive, the function terminates at 704. If the current node is active, the descent in the tree is started by obtaining children A and B of this node by the function CH( ) at 706.

Then an activity test is carried out in the left-hand child A of C, as described previously at 708. If the node A is active, then the left-hand descent is carried out at 710, by calling up Upd_Int_Val( ) with A.

Then an activity test is carried out on the right-hand child B of C, as described previously, at 712. If A is inactive, then the test 712 is carried out directly, and there is no left-hand descent for the node C.

If the node B is active, then the right-hand descent is carried out 714, by calling up Upd_Int_Val( ) with B. This is then the end of the recursive descent block 700 and the function continues with its actual processing part. If B is inactive, there is no right-hand descent for the node C, the block 700 terminates, and the function continues with its actual processing part.

Once the block 700 has been repeated and the recursions have been carried out, the processing of the data starts at the node C by restarting a list Upd(C) and a stack Q at 720.

The list Upd(C) serves to gradually raise the updated interaction data, from the data updated in the children of C during recursive call-ups carried out by means of the block 700.

The list Q serves as a storage stack for objects the interaction data of which have to be updated at the current node. Thus the list Q receives the list Upd(A), Upd(B), Int_Old_L(C) and Int_L(C) at 722. It will be noted that although Int_Old_L(C) and Int_L(C) contain pairs of nodes and not nodes, the skilled man will recognise that the operation 722 consists in stacking in Q only the nodes which are separate from one another.

A loop for raising interaction data thus begins at 724, with the unstacking of the list Q in a working node R. The working node R is added to the list Upd(C) at 726 in order to raise the data associated therewith during the unstacking of the recursions of the block 700. Then a test 728 is carried out to determine whether R belongs to the sub-set of objects designated A or the one designated B.

If R belongs to the sub-set of objects designated A, then the interaction data F(C, R) are reset with the value of F(A, R) at 730. If not, F(C, R) is reset with the value of F(B, R) at 732. Finally, a test on Q at 734 indicates whether all the interaction data of the objects of Q have been reset or not.

When Q is empty, an updating loop for interaction data begins at 736 with the unstacking of a list Int_L_t(C). The list Int_L_t(C) is a working copy of the list Int_L(C) and is used solely for the updating loop. The result of the unstacking of the list Int_L_t(C) is stored in a pair of working nodes (P, T).

At 738, the interactive data F(C, P) are updated by adding to the value of F(C, P) reset in the loop mentioned above the value F(P, T) of the interaction of T with P. The value of F(P, T) is calculated by means of a function F_Int( ) and gives the intensity of interatomic interaction of P with T, in the reference point of P. This same operation is carried out at 740 with T, by adding to the value of F(C, T) reset in the above loop the value F(T, P) of the interaction of P with T, within the reference point of T.

The function F_Int( ) is based on the well known formulae of electrostatic and van der Waals interaction between two atoms/molecules. Other formulae may of course be used. It is important to note that F_Int( ) calculates the interactions in the reference point associated with the first node invoked.

Then, at 742, a test checks whether Int_L_t(C) has been totally unstacked. If it has been, the relevant instance of Upd_Int_Val( ) terminates at 744. If not, the updating loop resumes at 736. Once the list Int_L_t(C) has been totally unstacked, the interaction data F(C, X), where X is a leaf node descended from C, represent all the interactions which have been undergone by the node X by all the other leaf nodes which are descendants of C.

It is clearly apparent, in the light of the foregoing, that the function Upd_Int_Val( ) has an approach from the bottom upwards, although it is invoked with the root node. It also appears that this function causes all the interactions undergone by each leaf node of a node C by the other leaf nodes of C to be gradually raised.

Finally, this function also retains a trace of the nodes whose interaction data have been updated by means of the list Upd ( ). Thus, when the function Upd_Int_Val( ) terminates, the root node RN contains on the one hand all the interaction data on its leaf nodes but also a list of the interaction data which have been updated in the current loop, ensuring that only the nodes which have actually evolved are accessed.

Once the function Upd_Int_Val( ) is terminated the function Upd_Int( ) ends. As shown in FIG. 2, the function Upd_Int( ) is followed by the function Sprd_Int( ) in the simulation loop. The function Sprd_Int( ) is called up with the root node RN, as its list Upd(RN) contains all the interaction data which have been modified by the function Upd_Int( ).

Figure 8:
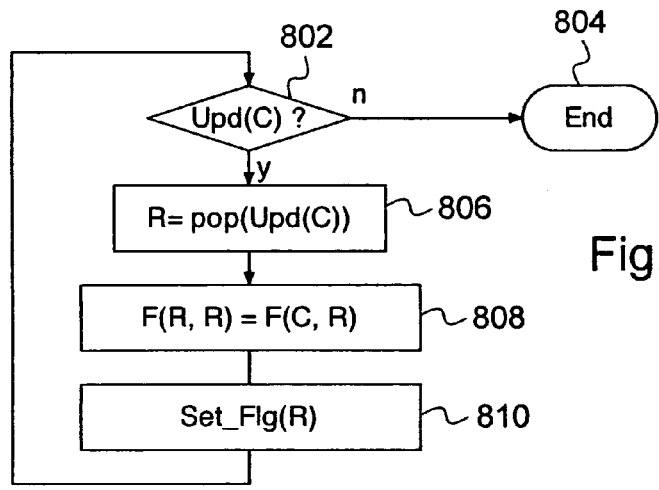
FIG. 8 shows a block diagram of a second function of the simulation loop in FIG. 2.

An example of implementation of this function is shown in FIG. 8. The function Sprd_Int is a loop which begins with a test 802 on the list Upd(C) of the input node. If this list is empty, the function terminates at 804.

When the list Upd(C) is not empty, an element R is unstacked at 806, the interaction data F(R, R) of the corresponding node are updated to the value F(C, R) at 808.

Then, a function Set_Flg( ) records the data Flg_bph associated with R at 810. The value of the data Flg_bph indicates the need to update the dynamic coefficients b, p and η. The function Set_Flg( ) also records the data Flg_bph for all the ascendants of the node R up to the root node RN. The loop then resumes at 802, until the list Upd(C) is empty.

It will be noted that the function Sprd_Int( ) can be implemented in a number of ways. Notably the interaction data updated are stored here in the node in question. However, it would be possible to store these interactions in another location, for example in a separate table. The same applies to the data recorded by the function Set_Flg( ).

It would also be possible not to run this function and to make do with calling up the list Upd(RN) in a suitable manner when necessary, although this would result in a certain lack of clarity and would introduce a relative management complexity.

When the interaction data have been updated, the simulation loop is extended with the function Get_Dyn_Coeff( ) which makes it possible to determine the dynamic parameters of the objects and nodes of the tree.

Figure 9:
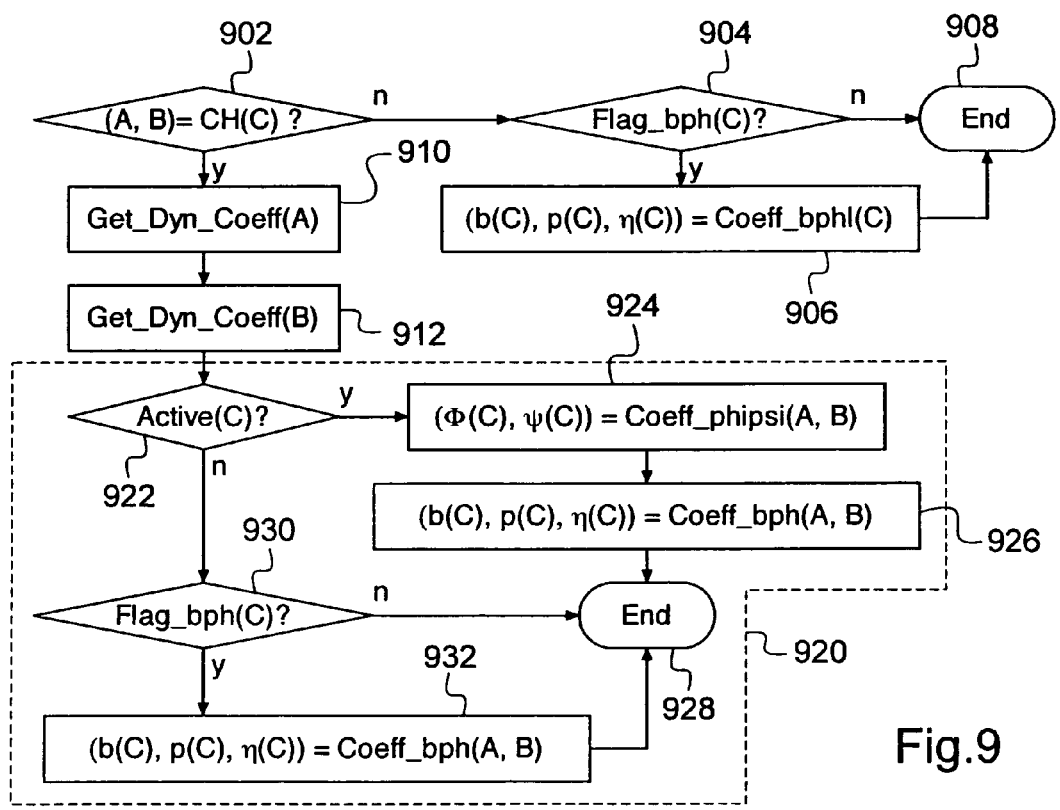
FIG. 9 shows a block diagram of a third function of the simulation loop in FIG. 2.

One example of implementation of the function Get_Dyn_Coeff( ) is shown in FIG. 9. The function Get_Dyn_Coeff( ) is a function of propagation from bottom to top, like the function Upd_Int_Val( ). In order to obtain this propagation a test 902 checks whether the node C has child nodes A and B.

If the node C has no child nodes, a test 904 checks whether the data Flg_bph(C) is activated. If this is the case, then the node C is a leaf node for which a function Coeff_bphl( ) is called up at 906, this function setting p(C) and η(C) at 0 and calculating b(C) from the updated interaction data F(C, C). After step 906, or if the data Flg_bph(C) is not activated, the function terminates at 908.

If the node C has children, the function Get_Coeff_Dyn( ) is called up recursively with A and B at 910 and 912. This ensures a scan of the necessary nodes of the binary tree from bottom to top. Once all the recursive calls have been launched and all the leaf nodes required have been treated, a resetting of the tree is carried out, recursion loop by recursion loop, in a block 920.

In the block 920, a first test 922 checks whether the current node C is active. If it is, the coefficients Φ(C) and Ψ(C) are calculated at 924 by calling up a function Coeff_phipsi( ) with the values of these coefficients for the children of C, namely A and B. Then the coefficients b(C), p(C) and η(C) are calculated at 926 by calling up a function Coeff_bph( ) with the values of these coefficients for the children of C, namely A and B. Finally, the function terminates at 928.

If the current node C is inactive, a test is carried out on the data Flg_bph(C) at 930. If the test is negative, the function terminates directly at 928. If this test is positive, i.e. if the data indicates that it is necessary to update the coefficients b(C), p(C) and η(C), these are calculated at 932 by calling up the function Coeff_bph( ) with the values of these coefficients for the children of C, namely A and B. Finally, the function terminates at 928.

The formulae (1) to (5) and (11) to (13) in annex A give the formula of the calculation on the basis of which these coefficients are established in the functions Coeff_phipsi( ) and Coeff_bph( ). For the purposes of the present description, it is sufficient to know that these coefficients determined recursively make it possible to describe locally the behaviour of the articulated bodies and serve as a basis for calculations of the metrics, acceleration and position of the simulation. For further information, the documents SPM '05 and SIGGRAPH '05 explain the precise definition and how to obtain these equations. The applicant recommends that these documents be consulted for this purpose.

It will be noted in particular that the calculation of the coefficients b(C), p(C) and η(C) may directly and indirectly involve a magnitude Q which represents a data item of active force on the articulation of a node C. This magnitude Q may be used for example to represent a couple dependent on a dihedral angle. If the calculation of the magnitude Q associated with the node C depends only on the relative position of the children A and B of C, this magnitude is updated solely for the active nodes. Thus, this update may be carried out for example immediately before the calculation of the b(C), p(C) and η(C) by the function Coeff_bph( ).

When the dynamic coefficients have been updated, the function Upd_Dyn( ) updates the dynamic data on the basis of these coefficients. An example of implementation of the function Upd_Dyn( ) is shown in FIG. 10.

Figure 10:
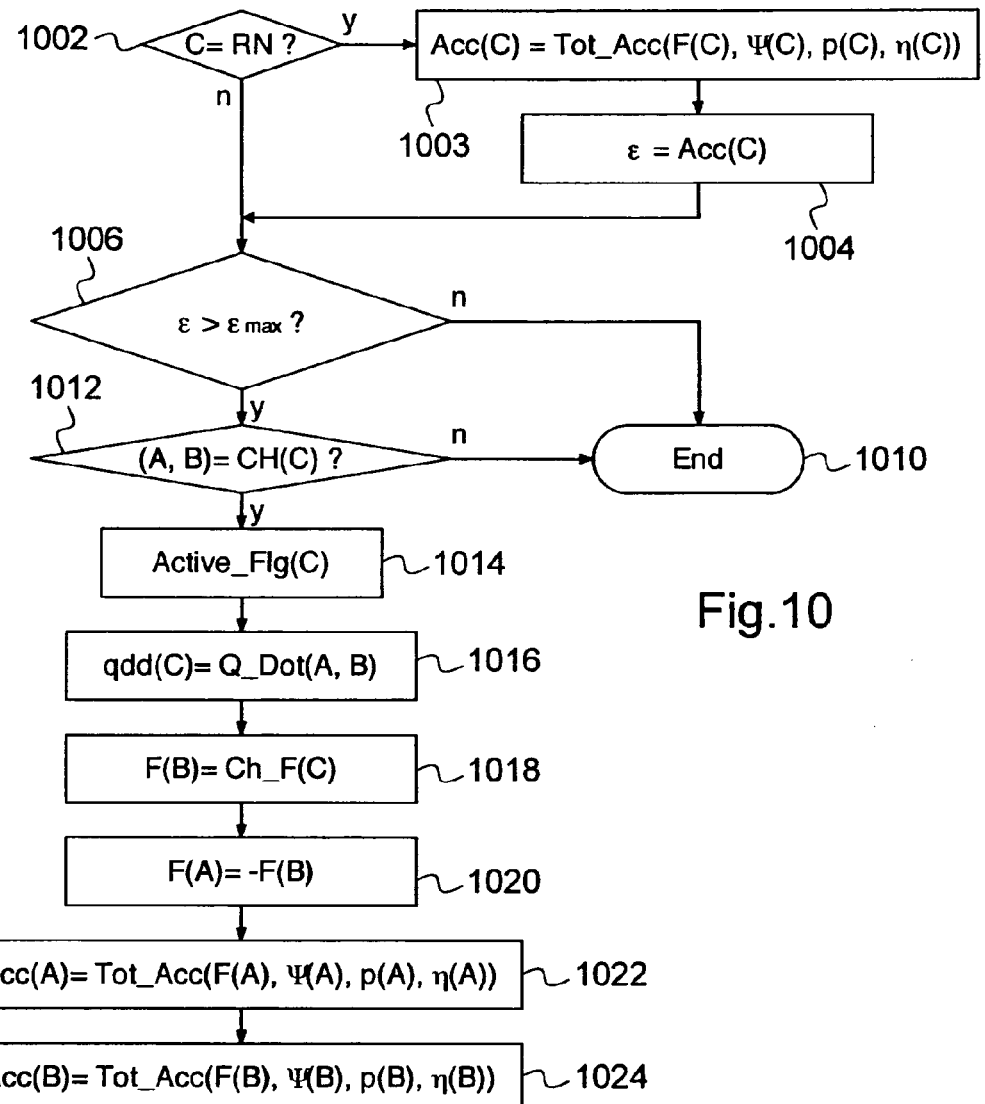
FIG. 10 shows a block diagram of a fourth function of the simulation loop in FIG. 2.
Figure 11:
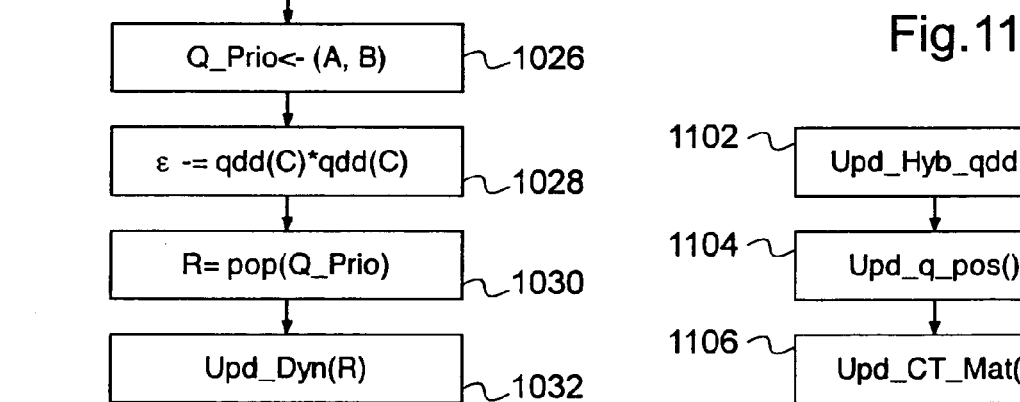
FIG. 11 shows a block diagram of a fifth function of the simulation loop in FIG. 2.

The function Upd_Dyn( ) shown in FIG. 10 is a recursive function which passes through the binary tree from top to bottom.

This function uses a priority queue which sets out to optimise the determination of the active nodes, as will be shown hereinafter. For this, a test 1002 on the current node calls up a calculation of the acceleration metrics 1003 if the current node is the root node RN. The result serves as a base at 1004 for a terminal $\epsilon$ which acts as the stop condition at 1006.

The calculation of the acceleration metric is carried out by a function Tot_Acc( ) which performs the calculation described in formula 21 of Annex A and which corresponds to the sum of the squares of the accelerations of the child nodes of the current node. This makes it possible to define the active and inactive nodes.

In fact, $\epsilon$max defines the desired simulation accuracy in terms of acceleration metric. Thus, if $\epsilon<\epsilon$max, this means that the desired precision is achieved. The acceleration of the node C qdd(C) is not therefore calculated and the function terminates at 1010.

On the other hand, if $\epsilon>\epsilon$max, the simulation is not regarded as being sufficiently precise. At 1012, a test determines whether the node C has children or not. If it does not, the function terminates at 1010.

A function Active_Flg(c) is then called up at 1014. The function Active_Flg( ) records an item of data which contains a time marker associated with the current simulation loop. It is this time marker that is used in the activity tests on a node. For this, for the given node, the optional time marker associated therewith is compared with the time marker of the current loop. If there is agreement, the node is deemed to be active. A similar method can be used to activate the data Flg_bph(C).

If the node C has children A and B, the acceleration of the node C qdd(C) is calculated at 1016 by means of the function Q_Dot. The function Q_Dot( ) uses the dynamic coefficients φ(C) and b(C) and a force F(C). The calculation carried out by the function Q_Dot( ) is explained by equation 22 in Annex A.

The force F(C) is a composite vector which represents all the articulation forces applied to the node C. For the root node RN, particular conditions make it possible to determine the vector F(C), as described in SPM '05 section 3.1.2.

As described in the article SPM '05 section 3.1.1, a vector F(C) has two components; F(1,C) and F(2,C). Within the scope of the invention, the vector F(C) of a node serves to calculate the vector of its child nodes F(A) and F(B).

In fact, if one looks at the two children A and B of C, then the force F(1,C) is equal to F(1,A) and the force F(2,C) is equal to F(2,B). Moreover, the components F(2,A) and F(1,B) may also be obtained starting from F(C) as described below. Consequently, the components of F(A) and F(B) may be obtained totally from F(C).

Once the acceleration of the node C has been calculated, the function Upd_Dyn( ) continues at 1018 and at 1020 with the calculation of the vectors F(2,A) and F(1,B) by means of the function Ch_F( ) according to formula 23 in Annex A.

Then the acceleration metrics of the nodes A and B are calculated at 1022 and 1024, and the nodes A and B are returned at 1026 to a priority queue Q_prio as a function of the values of Acc(A) and Acc(B). At 1028, the value of the square of the acceleration qdd(C) is subtracted from $\epsilon$ in order to update the precision of the simulation. Finally, a node R is unstacked from the queue Q_prio at 1030, and the function Upd_Dyn( ) is called up with R at 1032 to ensure recursion of the function and descent in the tree.

The queue Q_prio classifies the nodes according to the value of their acceleration metric in order to determine rapidly the nodes that are most important. Thus, as the acceleration metric of a node represents the sum of the squares of the accelerations of its children, the function progressively descends in the nodes which will cause c to decrease most rapidly, thus accelerating the simulation.

It will be noted that this function carries out two tasks at the same time. In fact, the activity of a node is based on the value of the acceleration metric. The non-calculation of the accelerations of certain nodes and the use of the data Active_Flg( ) thus also makes it possible to remove them from the following loops which take account of the activity without any additional calculation costs.

This is made possible in particular by the fact that the functions which scan the tree from bottom to top start by descending recursively only in the active nodes.

Consequently, the set of functions above, by selecting the active nodes, ensures minimal scanning of the tree and constitutes a selective updating of the data of some of the nodes.

It will also be noted that the accuracy of simulation is ensured here by means of the parameter $\epsilon$max which represents the maximum acceleration error. Other means may be used such as the specification of the number of nodes to be simulated, or other metrics.

When the updating of the dynamic data has been completed, the function Upd_Geo( ) terminates the simulation loop. In fact, as mentioned previously, the interaction data in the nodes are calculated in relation to a local reference point peculiar to each node.

In fact, the accelerations of the nodes and the positions that can be derived are also relative or intrinsic. In order to be able to display the results of the simulation and in order to be able to send the data back up (or back down) in the various scans of the tree, passage matrices which have not been discussed hitherto are now required.

It is these passage matrices that are used to calculate the actual position of the OBBs in the function Upd_Pos( ) in FIG. 4, or in order to update the force F(C, R) in the steps 732 and 734 in FIG. 7.

In order to update these matrices, the function Upd_Geo( ) starts at 1102 with a sub-function Upd_Hyb_qdd( ). The function Upd_Hyb_qdd( ) calculates the dynamic coefficients corrected to take account of the rigidification obtained with the function Upd_Dyn( ). Then the accelerations qdd(C) of the nodes are recalculated with the corrected dynamic coefficients. The operations carried out by this function and their intergration in the calculation of the qdd(C) are described in the article SIGGRAPH '05, sections 4 and 5.

Although it is described in the preferred embodiment of the invention, the function Upd_Hyb_qdd( ) is not absolutely necessary in every case. Optionally, the function Upd_Geo( ) may not contain this function and may proceed directly at 1104.

The function Upd_Geo( ) continues at 1104 with a function Upd_qpos( ), which updates the intrinsic positions of the nodes on the basis of their accelerations. This is a simple computation which represents a basic time integration. Other methods may be used for updating the intrinsic positions of the nodes, using for example calculations of supplementary accelerations.

Finally, the function Upd_Geo( ) terminates at 1106 with the function Upd_CT_Mat( ), which updates the internal matrices mentioned above on the basis of the updated intrinsic positions of the nodes. These matrices and their updating are described in more detail in section 5 of SPM '05.

In the foregoing description the interaction and geometry data are chiefly calculated intrinsically, i.e. in relation to a local reference point associated in every case with the node in question.

This means that there is no need to recalculate the data which depend solely on the relative positions of the objects, such as the coefficients $\phi(C)$ and $\psi(C)$ and the local interaction forces. Thus, the transition to the coordinates of the real world is only needed to calculate the actual positions of the nodes.

In other embodiments it would be possible to operate every time on data of coordinates in the real world, retaining the intrinsic data only for the nodes which are not active.

Although the present invention has been described in relation to the representation by means of a binary tree it would be possible to use other types of tree, for example ternary or n-ary. It would also be possible to use other types of representations, provided that they make it possible to differentiate active and inactive nodes at a comparable scanning cost.

The functions described above contain the main steps for performing the invention. They may be used by the skilled man as a basis for producing a computer program that implements the invention. Such a programme may be designed in C++ language or any other computer language that is appropriate, as the skilled man will know.

Annexe A

Section 1

$$\Phi^C = \begin{bmatrix} \Phi_1^C & \Phi_{12}^C \\ \Phi_{21}^C & \Phi_2^C \end{bmatrix} \quad (1)$$

-continued $$\Phi_1^C = \Phi_1^A - \Phi_{12}^A W \Phi_{21}^A \quad (2)$$

$$\Phi_2^C = \Phi_2^B - \Phi_{21}^B W \Phi_{12}^B$$

$$\Phi_{21}^C = \Phi_{21}^B W \Phi_{21}^A = (\Phi_{12}^C)^T$$

with $$V = (\Phi_2^A + \Phi_1^B)^{-1} \quad (3)$$

$$W = V - VS(S^T V S)^{-1} S^T V$$

where S is the movement sub-space of the node, of dimensions 6×number of degrees of freedom of the node. Typically, $S=(0,0,1,0,0,1)^T$.

$$\Psi(C) = \begin{bmatrix} \Psi_1^C & \Psi_{12}^C \\ \Psi_{21}^C & \Psi_2^C \end{bmatrix} \quad (4)$$

$$\Psi_1^C = \Psi_1^A + \Psi_{21}^A - (\Phi_{12}^A W \Psi_{21}^A + \Psi_{12}^A W \Phi_{21}^A)$$

$$\Psi_2^C = \Psi_2^B + \Phi_{21}^B Y \Phi_{12}^B - (\Phi_{21}^B W \Psi_{12}^B + \Psi_{21}^B W \Phi_{12}^B)$$

$$\Psi_{21}^C = -\Phi_{21}^A Y \Phi_{21}^A + \Phi_{21}^B W \Psi_{21}^A + \Psi_{21}^B W \Phi_{21}^A = (\Psi_{12}^C)^T$$

with $$U = (S^T V S)^{-1} S^T V \quad (5)$$

$$N = U^T U$$

$$Y = N + W(\Psi_2^A + \Psi_1^B)W$$

Note: The matrices $\Phi(C)$ and $\Psi(C)$ are matrix matrices.

Annexe A (continued)

Section 2

$$b(C) = \begin{bmatrix} b_1^C \\ b_2^C \end{bmatrix} \quad (11)$$

$$b_1^C = b_1^A - \Phi_{12}^A \gamma$$

$$b_2^C = b_2^B + \Phi_{21}^B \gamma$$

with $$\beta = b_2^A - b_1^B$$

$$\gamma = W\beta + VS(S^T V S)^{-1} Q,$$

where Q is the vector of dimension number of degrees of freedom×1 of the active forces of the node $$p(C) = \begin{bmatrix} p_1^C \\ p_2^C \end{bmatrix} \quad (12)$$

$$p_1^C = p_1^A - \Phi_{12}^A Z - 2\Psi_{12}^A \gamma$$

$$p_2^C = p_2^B + \Phi_{21}^B Z + 2\Psi_{21}^B \gamma$$

$$\eta^C = \eta^A + \eta^B + R^T R + \gamma^T (\Psi_2^A + \Psi_1^B) \gamma^T (P_2^A - P_1^B)$$

with $$R = (S^T V S)^{-1}(Q - S^T B \beta) \quad (13)$$

$$Z = 2U^T R + W(P_2^A - P_1^B) - 2W(\Psi_2^A + \Psi_1^B) \gamma$$

Annexe A (continued)

Section 3

$$Acc(C) = \begin{bmatrix} f_1^A \\ f_2^B \end{bmatrix}^T \begin{bmatrix} \Psi_1^C & \Psi_{12}^C \\ \Psi_{21}^C & \Psi_2^C \end{bmatrix} \begin{bmatrix} f_1^A \\ f_2^B \end{bmatrix} + \begin{bmatrix} f_1^A \\ f_2^B \end{bmatrix}^T \begin{bmatrix} p_1^C \\ p_2^C \end{bmatrix} + \eta^C \quad (21)$$

-continued $$qdd(C) = (S^T V S)^{-1}(Q - S^T V(\Phi_{12}^A f_1^A - \Phi_{21}^B f_{21}^B + \beta)) \quad (22)$$

$$f_1^B = W\Phi_{21}^A f_1^A - W\Phi_{12}^B f_2^B + \gamma \quad (23)$$
$$f_2^A = -f_1^B$$

The invention claimed is:

1. A computer device for simulating a set of objects in interaction, comprising:
   a memory adapted to contain a tree representation of the set of objects wherein said tree representation includes nodes comprising leaf nodes representing objects and intermediate nodes representing articulations between its child nodes, in which each intermediate node is associated with dynamic data, geometric data and interaction data dependent on data of its child nodes wherein said interaction data represent forces applied to objects represented by said child nodes, and
   a simulation controller for actuating, in a repetitive cycle:
      a distributor of the interaction data relating to the objects and subsets of objects,
      a mechanism for updating the dynamic data, with a scan of the tree representation for nodes subject to interactions, as a function of the interaction data and geometric data in question,
      a mechanism for updating the geometric data, with a scan of the tree representation for nodes subject to interactions, as a function of the updated dynamic data, characterised in that
   the memory also comprises local interaction data that are associated with at least some of the intermediate nodes, wherein local interaction data associated with an intermediate node represent forces applied to objects represented by said child nodes by other objects represented by said child nodes, other than constraint forces due to interaction, via the articulations, between said objects and said other objects;
   the interaction data distributor comprises an interaction data updating mechanism, with a scan of the tree representation for nodes subject to interaction, in order to update an interaction data item of an intermediate node as a function of the local interaction data of the child nodes in question, wherein the local interaction data comprise an interaction list containing couples that denote locally interacting nodes, and the interaction data updating mechanism is configured to:
      update the data in the interaction list, and
      update the interaction data, on the basis of at least some of the data in the interaction list that have been updated.

2. The device according to claim 1, characterised in that:
   the memory comprises, for at least some of the nodes associated with local interaction data, oriented box data representing an interaction space around an associated node, and
   the mechanism for updating the interaction data further has a function of updating the oriented box data, wherein the updating the data in the interaction list operate on the basis of at least some of the oriented box data that have been updated.

3. The device according to claim 1, characterised in that:
   the memory comprises, for at least some of the nodes, dynamic coefficient data, and
   the mechanism for updating the dynamic data comprises:
      a function of updating the dynamic coefficient data, and
      a function of updating the dynamic data, on the basis of the dynamic coefficient data that have been updated.

4. The device according to claim 1, characterised in that the memory comprises, for at least some of the nodes, data representing an activity marker (Activity_Flg( )),
   the mechanism for updating the dynamic data is also capable of updating the activity marker (Activity_Flg( )) of a node which it is processing, and
   wherein at least one selected from among the mechanism for updating the interaction data, the mechanism for updating the dynamic data, and the mechanism for updating the geometric data is designed to scan the tree representation, ignoring the nodes that are not marked as active.

5. A method for simulating behaviour of a set of objects in interaction, in which a tree representation of the set of objects is maintained, wherein said tree representation includes nodes comprising leaf nodes representing objects and intermediate nodes representing articulations between its child nodes, wherein each intermediate node is associated with dynamic data, geometric data and interaction data dependent on data from its child nodes, wherein said interaction data represent forces applied to objects represented by said child nodes, the method comprising:
   a. distributing by a computer the interaction data over some of the objects and subsets of objects,
   b. scanning by the computer the tree representation for nodes subject to interaction, while updating the dynamic data of these nodes, as a function of the interaction data and geometric data in question, and
   c. scanning by the computer the tree representation again for nodes that are subject to interaction, while updating the geometric data, as a function of the dynamic data as updated in step b,
characterised in that step a comprises:
   a1. a preliminary scan of the tree representation for nodes that are subject to interaction, with the updating of the interaction data of intermediate nodes, as a function of local interaction data of child nodes in question, wherein local interaction data associated with an intermediate node represent forces applied to objects represented by said child nodes by other objects represented by said child nodes, other than constraint forces due to interaction, via the articulations, between said objects and said other objects, wherein step a1 comprises:
      a1a. updating interaction lists forming local interaction data, each interaction list comprising couples of nodes interacting locally, and
      a1b. updating interaction data, as a function of the updated interaction lists.

6. The method according to claim 5, characterised in that step a1a comprises:
   a1a1. updating oriented box data associated with at least some of the nodes, the oriented box data representing an interaction space about an associated node, and a1a2. Updating the interaction lists as a function of the updated oriented box data.

7. The method according to claim 5, characterised in that at least one of steps a, b and c comprises scanning the tree representation while ignoring at least some of the nodes, as a function of an activity marker associated with said at least some of the nodes.

8. A non-transitory computer readable medium storing program code instructions for executing the steps of the process according to claim 5 when the program code instructions are run on a computer.

* * * * *